United States Patent [19]

Nusair

[11] Patent Number: 5,125,110
[45] Date of Patent: Jun. 23, 1992

[54] MICROSTRIPLINE MICROWAVE MIXER USING WAVEGUIDE FILTER

[75] Inventor: Marwan E. Nusair, Cincinnati, Ohio

[73] Assignee: Valentine Research, Inc., Cincinnati, Ohio

[21] Appl. No.: 599,048

[22] Filed: Oct. 17, 1990

[51] Int. Cl.$^5$ .............................................. H04B 1/26
[52] U.S. Cl. ..................................... 455/327; 455/330
[58] Field of Search ............... 455/317, 323, 325, 328, 455/330, 327

[56] References Cited

U.S. PATENT DOCUMENTS

| | | |
|---|---|---|
| 4,276,655 | 6/1981 | Kraemer et al. . |
| 4,406,020 | 9/1983 | Reindel . |
| 4,412,354 | 10/1983 | Hu . |
| 4,450,584 | 5/1984 | Saka et al. . |
| 4,531,236 | 7/1985 | Ishihara . |
| 4,553,266 | 11/1985 | Bates et al. . |
| 4,563,773 | 1/1986 | Dixon, Jr. et al. . |
| 4,603,435 | 7/1986 | Butler .................................. 455/327 |
| 4,651,115 | 3/1987 | Wu . |
| 4,654,887 | 3/1987 | Murphy et al. . |
| 4,660,008 | 4/1987 | Henry et al. . |
| 4,661,997 | 4/1987 | Roberts et al. . |
| 4,661,999 | 4/1987 | Ullmann et al. . |
| 4,677,693 | 6/1987 | Takayama ........................... 455/330 |
| 4,812,789 | 3/1989 | Lee . |
| 4,864,645 | 9/1989 | Dixon, Jr. et al. . |

*Primary Examiner*—Curtis Kuntz
*Attorney, Agent, or Firm*—Killworth, Gottman Hagan & Schaeff

[57] ABSTRACT

A microstripline microwave mixer circuit includes a waveguide microstrip filter formed by coupling a section of ridged waveguide to a microstripline circuit. The ridged waveguide based microstrip filter both serves as a high-pass filter for RF input signals and also provides a suitable termination for the RF input side of the mixer circuit resulting in a compact multifrequency mixer circuit with good performance. The section of ridged waveguide is coupled to the microstripline circuit such that the dielectric substrate of the microstripline circuit is within the waveguide section thereby increasing the effective dielectric constant of the waveguide interior and decreasing the dimensions of the waveguide. This configuration of the high-pass filter presents a smaller component than would be present in air-filled waveguide mixer circuits.

7 Claims, 1 Drawing Sheet

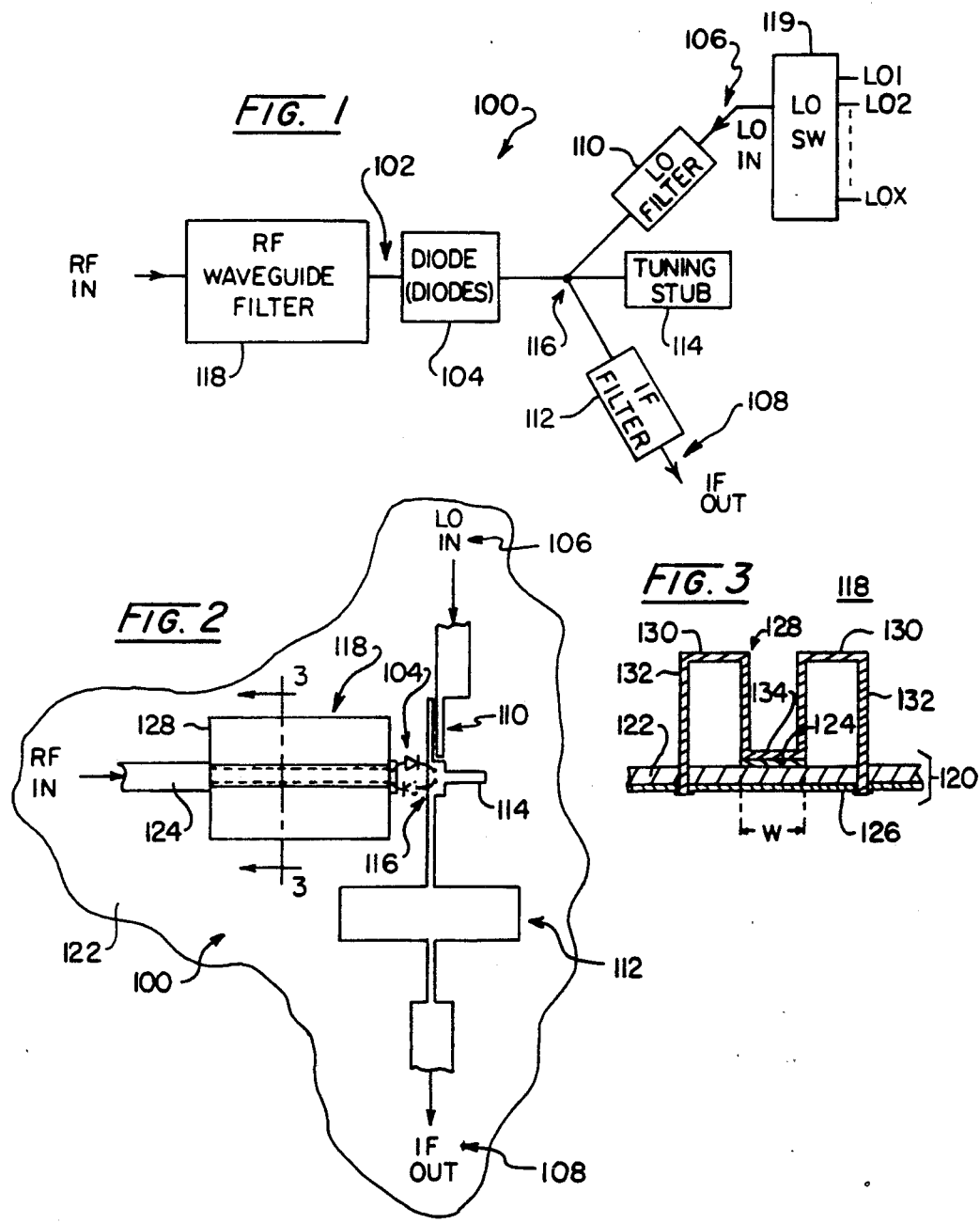

MICROSTRIPLINE MICROWAVE MIXER USING WAVEGUIDE FILTER

BACKGROUND OF THE INVENTION

The present invention relates generally to microwave mixer circuits and, more particularly, to a compact microstripline microwave mixer circuit utilizing a waveguide filter.

One of the difficulties in designing microwave mixer circuits is realizing correct terminations at the various signal frequencies within the mixer circuits. The frequencies of these signals is determined by a mixer's physical configuration, the desired radio frequency (RF) input signals, the local oscillator (LO) signal or signals and intermediate frequency (IF) output signals.

It is known in the art that the performance of a mixer circuit critically depends on the correct termination at the RF input, the LO input, and the IF output for a large number of frequencies. The frequencies of concern include not only the frequencies of the noted signals but also the sums and differences of those frequencies and their harmonics to some order, infinite in theory but finitely truncated in practice.

In microstripline mixer circuits, such terminations have taken the form of tuned stubs, either open ended or shorted, placed at suitable distances along the microstripline. In general, simple devices of this type serve to properly terminate the fundamental frequencies and possibly their odd harmonics; however, usually the many sums and differences of harmonics are not properly terminated. Thus, proper terminations on microstripline mixer circuits usually require multiple matching sections and stubs to cover several frequencies and bands, thereby taking up substantial space on the microstripline substrate. Waveguide mixers also require tuned lengths and terminations, which also tend to be large and space consuming.

Accordingly, there is a need for a microstripline microwave mixer circuit which provides good performance in a compact space.

SUMMARY OF THE INVENTION

This need is met by the microstripline microwave mixer circuit of the present invention which includes a waveguide microstrip filter formed by coupling a section of ridged waveguide to a microstripline circuit. The ridged waveguide based microstrip filter both serves as a high-pass filter for RF input signals and also provides a suitable termination for the RF input side of the mixer circuit resulting in a compact multifrequency mixer circuit having good performance characteristics. The section of ridged waveguide is coupled to the microstripline circuit such that the dielectric substrate of the microstripline circuit is within the waveguide section thereby increasing the effective dielectric constant of the waveguide interior and decreasing the dimensions of the waveguide. This configuration of the high-pass filter presents a smaller component than would be present in air-filled waveguide mixer circuits.

In accordance with one aspect of the present invention, a microstripline microwave mixer circuit comprises high-pass waveguide filter means having an input for receiving radio frequency signals and an output. Band-pass filter means having an input and an output is connected to receive a local oscillator signal and pass it to a circuit junction. Low-pass filter means having an input connected to the junction passes intermediate frequency signals from the mixer circuit. Stub means are connected to the junction for setting its impedance. Finally, diode means are connected between the output of the high-pass waveguide filter means and the junction.

In the preferred embodiments, the cutoff frequency of the high-pass waveguide filter means is set at a frequency Fc, the intermediate frequency signals are selected to be less than a frequency Fi, the frequency of the local oscillator signal is selected to be between the frequencies Fi and Fc, and the diode means comprises a single diode. For a second harmonic mixer embodiment, the cutoff frequency of the high-pass waveguide filter means is set at a frequency Fc, the intermediate frequency signals are selected to be less than a frequency Fi, the frequency of the local oscillator signal is selected to be between the frequencies Fi and Fc, and the diode means comprises a diode pair. The microwave mixer can further comprise switch means for switching between two LO signals or among more than two LO signals.

In one working embodiment of a second harmonic mixer according to the present invention and including a diode pair, Fc is approximately 19.6 GHz, Fi is approximately 7 GHz, the radio frequency signals to be received are in two bands, 24.025-24.275 GHz and 34.175-34.425 GHz, and the frequency of the local oscillator is approximately 14.62 GHz. In an alternate of this working embodiment having expanded RF signal reception, Fc is approximately 19.6 GHz, Fi is approximately 7 GHz, the radio frequency signals to be received are in two bands, 24.0-24.3 GHz and 34.0-36.0 GHz, and the frequency of the local oscillator signal is switched between local oscillator signals in the ranges of 16-17 GHz and 12-13 GHz.

Preferably, the high-pass waveguide filter means comprises a microstrip circuit having a dielectric substrate with a microstrip line on one side and a ground plane on the other and a length of single-ridge waveguide coupled thereto. The length of waveguide has a top wall and sidewalls with a ridge projecting centrally from the top wall into the waveguide. The sidewalls extend through the dielectric substrate parallel to and on opposite sides of the microstrip line and are connected electrically and physically to the ground plane to form a bottom wall for the waveguide. The ridge has a width which is equal to or narrower than the microstrip line and is aligned with and in good electrical and physical contact therewith. In one working embodiment of the invention, the ridge has a width which is narrower than the microstrip line and the microstrip line is reduced in width within the length of single-ridge waveguide to equal the width of the ridge.

It is thus an object of the present invention to provide an improved microstripline microwave mixer circuit including a waveguide filter; to provide an improved microstripline microwave mixer circuit including a waveguide filter wherein the waveguide filter comprises a high-pass input filter for RF signals for the mixer circuit; to provide an improved microstripline microwave mixer circuit including a waveguide filter wherein the waveguide filter comprises a high-pass input filter for RF signals for the mixer circuit, the cutoff frequency of the high-pass waveguide filter means being set at a frequency Fc, the intermediate frequency signals being selected to be less than a frequency Fi, the frequency of the local oscillator signal or signals being selected to be between the frequencies Fi and Fc, and the diode means comprising a single diode; and, to provide an improved microstripline microwave second harmonic mixer circuit including a waveguide filter wherein the waveguide filter comprises a high-pass input filter for RF signals for the mixer circuit, the cutoff frequency of the high-pass waveguide filter means being set at a frequency Fc, the intermediate frequency signals being selected to be less than a frequency Fi, the frequency of the local oscillator signal or signals being selected to be between the frequencies Fi and Fc, and the diode means comprising a diode pair.

Other objects and advantages of the invention will be apparent from the following description, the accompanying drawings and the appended claims.

BRIEF DESCRIPTION OF THE DRAWING

FIG. 1 is a schematic block diagram of a microstripline mircrowave mixer circuit in accordance with the present invention;

FIG. 2 is a plan view of a physical layout of the microstripline microwave mixer circuit of FIG. 1; and FIG. 3 is a sectional view of the waveguide filter of FIG. 2 taken along the section line 3—3 of FIG. 2.

DETAILED DESCRIPTION OF THE INVENTION

The inclusion of a ridged waveguide-based microstrip filter in a microstripline microwave mixer serves a dual function as a high-pass input filter for incoming RF signals and also as a suitable termination for the RF input side of the mixer circuit. The mixer circuit design of the present invention including the RF waveguide filter improves on existing designs and results in a multifrequency mixer circuit with good performance and one which occupies a relatively small space. The presence of the dielectric substrate of the microstrip within the waveguide section increases the effective dielectric constant of the waveguide interior, thereby decreasing the dimensions of the waveguide.

In the invention of the present application, the mixer circuit includes the following properties: 1) the RF frequencies desired are higher than some microwave frequency Fc; 2) the IF frequencies are selected to be lower than some microwave frequency Fi; and, 3) the LO frequency signal or signals fall between Fi and Fc. In the case of a fundamental frequency mixer, a single diode is used as the mixer element. A diode pair is preferably used as the mixer element for a second harmonic mixer circuit.

The basic mixer circuit 100 is depicted in schematic block diagram form in FIG. 1. The RF input point is on one side 102 of the diode or diodes 104, while the input point 106 for the LO signal or signals and output point 18 for the IF signals are on the other or output side of the diode or diodes 104. Because the frequencies are related to each other in the manner described above, a band-pass filter 110 is used to deliver the LO signal or signals. A low-pass filter 112 with cutoff at Fi is used to deliver the IF signal. In addition, at least one short tuning stub 114 is placed at the junction point 116 of the LO signal input, the IF signal output, and the diode or diodes 104. The tuning stub 114 or stubs if more than one is used, is selected in such a way that the impedance at the junction point 116 is the correct one for the frequencies of the signals within the mixer circuit 100.

The RF input signals come directly into the mixer circuit 100 through a ridged waveguide filter 118. The ridged waveguide filter 118 serves to both filter the incoming RF signals and also to correctly terminate the RF signal input side of the mixer diode or diodes 104 such that no further filtering or matching is necessary for the mixer circuit 100. The ridged waveguide filter 118 is designed so that its cutoff frequency is at or above Fc, and such that Fc is sufficiently higher than the frequency or frequencies of the local oscillator signal or signals so that the impedance presented at the LO frequency or frequencies, is very low, thereby properly terminating the RF signal input end 102 of the diode or diodes 104 at that frequency.

The impedance of a ridged waveguide section, partially filled with a dielectric substrate, has a very small real component, closely approximating a short circuit for all frequencies below its cutoff value. The reactance of the waveguide section is inductive and becomes progressively smaller as the frequency goes down well below cutoff. Therefore, for frequencies far below cutoff, the waveguide section appears as a short circuit to ground, while for frequencies below but nearer to cutoff, the waveguide section appears as a small inductor to ground. The inductance here is less than that of an air filled rectangular waveguide, however, and decreases as the frequency decreases more rapidly than for an air filled rectangular waveguide. Since the IF frequency is even lower than the frequency or frequencies of the LO signal or signals, the input end 12 of the diode or diodes 104 is very close to a short circuit at the frequency of the IF signal, thereby enhancing the performance of the mixer circuit 10. In particular, since an electrical short circuit at relatively low IF frequencies is normally realized with a relatively large structure, and since this is normally complicated by the need for a wideband IF response, the present invention gives a wideband IF short circuit at the input end 102 of the diode or diodes 104 in a very compact structure.

On the output side of the diode or diodes 104, the band-pass filter 110 for the LO signal or signals, tuned to the desired frequency of the LO signal or signals, and the low-pass filter 112 together give a low impedance at the RF frequencies found on the output side of the diode or diodes 104 The tuning stub 114 or stubs if more than one stub is used, tune this impedance to zero at the desired frequency or frequencies of the RF input signal. Other harmonic products of the mixer circuit 100 are terminated with a low impedance if they fall below Fc, on the input side of the diode or diodes 104.

One working embodiment of the present invention is a second harmonic mixer using a pair of mixer diodes and designed for RF signal input frequencies in two bands: 24.025 to 24.275 GHz; and, 34.175 to 34.425 GHz. The frequency of the local oscillator signal is selected to be 14.62 GHz. Additionally, the ridged waveguide microstrip filter is designed so that its cutoff frequency is equal to Fc which is equal to 19.6 GHz. This gives an IF frequency of approximately 5 GHz for either RF input band.

The preferred embodiment of the present invention is a second harmonic mixer using a pair of mixer diodes and designed for RF signal input frequencies in two bands: 24.0 to 24.3 GHz; and, 34.0 to 36.0 GHz. The frequency of the LO signal is repetitively switched between at least two LO signals, one or more with a frequency in the range of 16 to 17 GHz and one with a frequency in the range of 12.8 to 13.0 GHz. Additionally, the ridged waveguide microstrip filter is designed so that its cutoff frequency is equal to Fc which is equal to 19.6 GHz. This gives an IF range of approximately 2 GHz for either RF input band.

Switching of the LO signals is performed by switch means shown generally in FIG. 1 as a microwave switch 119 which is capable of switching between two or more LO signals LO1-LOX. The ability to switch between two LO signals or among a plurality of LO signals provides the further capability of being able to accept incoming RF signals which may otherwise not be processed by the mixer circuit. The acceptance of such signals is important in circuits for the detection of microwave signals used for example in the monitoring of motor vehicle speeds, an application for which the present invention is particularly applicable.

A plan view of a physical layout of the mixer circuit 100 is shown schematically in FIG. 2 and corresponding circuit elements will be indicated by the same numerals used in FIG. 1. The diode or diodes 104 are beam lead GaAs Schottky diodes, positioned so that one side of each diode is positioned as closely as practicable to the ridged waveguide filter 118. The other side of the diode or diodes 104 comprises the band-pass filter 110 which is a band-pass coupled line filter broadly tuned to 12-17 GHz, and the low-pass filter 11 which is a low-pass 3-section filter tuned for a threshold frequency of approximately 7 GHz. short tuning stub 114 is cut to the correct size by trial and error for minimum conversion loss in the mixer for the 24 GHz band. Measured conversion loss for a working embodiment of the mixer circuit 100 is approximately 7 dB, with a noise figure of 8 dB, at 24 GHz. At 34 GHz, the conversion loss is approximately 11 dB, with noise figure estimated at 12 dB. This performance is particularly satisfactory in view of the compactness of the mixer circuit 100, its low parts count, and its relatively low cost compared to prior art mixer circuits.

FIG. 3 shows the construction of the ridged waveguide filter 118 for use in the mixer circuit 100 of the present invention. The ridged waveguide filter 118 comprises a microstrip circuit 120 having a dielectric substrate 122 with a microstrip line 124 on one side and a ground plane 126 on the other side. A length of single-ridge waveguide 128 has a top wall 130 and sidewalls 132 with a ridge 134 projecting centrally from the top wall 130 into the waveguide 128. The sidewalls 132 extend through the dielectric substrate 122 parallel to and on opposite sides of the microstrip line 124 and are connected electrically and physically to the ground plane 126 to form a bottom wall for the waveguide 128. The ridge 134 has a width which is equal to or narrower than the microstrip line 124 and is aligned with and in good electrical and physical contact therewith. In the illustrated embodiment, the ridge 134 has a width which is narrower than the microstrip line 124 and the microstrip line 124 is reduced in width within the length of single-ridge waveguide 128 to equal the width of the ridge 134.

Those interested in additional information regarding the design and construction of the ridged waveguide filter 118 are referred to U.S. Pat. No. 4,994,775 which issued on Feb. 19, 1991, is assigned to the assignee of the present application and is incorporated herein by reference.

Having thus described the microstripline microwave mixer using a waveguide filter of the present invention in detail and by reference to preferred embodiments thereof, it will be apparent that modifications and variations are possible without departing from the scope of the invention defined in the appended claims.

What is claimed is:

1. A microstripline microwave mixer circuit comprising:
   high-pass waveguide filter means having an input for receiving radio frequency signals and an output, said high-pass waveguide filter means comprising a microstrip circuit having a dielectric substrate with a microstrip line on one side and a ground plane on the other, and a length of single-ridge waveguide having a top wall and sidewalls with a ridge projecting centrally from the top wall into said waveguide, said sidewalls extending through said dielectric substrate parallel to and on opposite sides of said microstrip line and being connected electrically and physically to said ground plane to form a bottom wall for said waveguide, said ridge having a width which is equal to or narrower than said microstrip line and being aligned with and in good electrical and physical contact therewith;
   band-pass filter means having an input for receiving a local oscillator signal and an output connected to a junction;
   low-pass filter means having an input connected to said junction for passing intermediate frequency signals;
   stub means connected to said junction for setting a desired impedance for said junction; and
   diode means connected between the output of said high-pass waveguide filter means and said junction means.

2. A microstripline microwave mixer circuit as claimed in claim 1 wherein the cutoff frequency of said high-pass waveguide filter means is set at a frequency Fc, the intermediate frequency signals are less than a frequency Fi, the frequency of the local oscillator signal is between the frequencies Fi and Fc and said diode means comprises a single diode.

3. A microstripline microwave mixer circuit as claimed in claim 1 wherein the cutoff frequency of said high-pass waveguide filter means is set at a frequency Fc, the intermediate frequency signals are less than a frequency Fi, the frequency of the local oscillator signal is between the frequencies Fi and Fc and said diode means comprises a diode pair.

4. A microstripline microwave mixer circuit as claimed in claim 3 wherein Fc is approximately 19.6 GHz, Fi is approximately 7 GHz, the radio frequency signals to be received are in two bands, 24.025-24.275 GHz and 34.175-34.425 GHz, and the frequency of the local oscillator is approximately 14.62 GHz.

5. A microstripline microwave mixer circuit as claimed in claim 3 further comprising switch means for switching between two or more local oscillator signals.

6. A microstripline microwave mixer circuit as claimed in claim 5 wherein Fc is approximately 19.6 GHz, Fi is approximately 7 GHz, the radio frequency signals to be received are in two bands, 24.0-24.3 GHz and 34.0-36.0 GHz, and the frequency of the local oscillator is switched between local oscillator signals in the ranges of 16-17 GHz and 12-13 GHz.

7. A microstripline microwave mixer circuit as claimed in claim 1 wherein said ridge has a width which is narrower than said microstrip line and said microstrip line is reduced in width within said length of single-ridge waveguide to equal the width of said ridge.

* * * * *